US011444591B2

(12) United States Patent
Kovacic et al.

(10) Patent No.: US 11,444,591 B2
(45) Date of Patent: Sep. 13, 2022

(54) DEVICE AND METHOD FOR A WIRELESS TRANSMITTER

(71) Applicants: STMicroelectronics SA, Montrouge (FR); STMicroelectronics (Alps) SAS, Grenoble (FR); STMicroelectronics razvoj polprevodnikov d.o.o., Ljubljana (SI)

(72) Inventors: Kosta Kovacic, Orehova vas (SI); Christophe Grundrich, Le Sappey en Chartre (FR); Bruno Leduc, Voiron (FR); Anton Stern, Preddvor (SI)

(73) Assignees: STMICROELECTRONICS RAZVOJ POLPREVODNIKOV D.O.O., Ljubljana (SI); STMICROELECTRONICS (ALPS) SAS, Grenoble (FR); STMICROELECTRONICS SA, Montrouge (FR)

( * ) Notice: Subject to any disclaimer, the term of this patent is extended or adjusted under 35 U.S.C. 154(b) by 184 days.

(21) Appl. No.: 16/915,766

(22) Filed: Jun. 29, 2020

(65) Prior Publication Data

US 2021/0006215 A1     Jan. 7, 2021

(30) Foreign Application Priority Data

Jul. 1, 2019   (EP) ..................... 19305889

(51) Int. Cl.
*H03F 3/04* (2006.01)
*H03F 3/24* (2006.01)
(Continued)

(52) U.S. Cl.
CPC ............. *H03F 3/24* (2013.01); *H03F 1/0227* (2013.01); *H03F 3/217* (2013.01);
(Continued)

(58) Field of Classification Search
CPC .......... H03F 3/24; H03F 1/0227; H03F 3/217; H03F 2200/102; H03F 2200/351;
(Continued)

(56) References Cited

U.S. PATENT DOCUMENTS

| 8,358,974 | B2   | 1/2013 | Kunc et al. |
| 9,020,453 | B2 * | 4/2015 | Briffa ...................... H03F 3/211 |
|           |      |        | 455/127.1 |

(Continued)

FOREIGN PATENT DOCUMENTS

| EP | 2393251    | 12/2011 |
| EP | 3182608 B1 | 8/2018  |

*Primary Examiner* — Khanh V Nguyen
(74) *Attorney, Agent, or Firm* — Slater Matsil, LLP (57) ABSTRACT

A method for controlling a signal envelope shape of modulation pulses in a driver of a wireless transmitter includes supplying a first voltage to the driver during a non-modulated state, supplying a second voltage configurable by a configurable modulation index value to the driver during a modulated state, switching between the non-modulated state and the modulated state comprising setting the modulation index value to configure the second voltage level at the same level as the first voltage and then switching between supplying the first voltage to the driver and supplying the second voltage to the driver, and filtering to a limited bandwidth the variations of the second voltage resulting from configuring the modulation index value.

20 Claims, 4 Drawing Sheets

(51) Int. Cl.
  *H03F 1/02*      (2006.01)
  *H03F 3/217*     (2006.01)
  *H04L 25/49*     (2006.01)
  *H04L 27/26*     (2006.01)

(52) U.S. Cl.
  CPC ...... *H04L 25/4902* (2013.01); *H04L 27/2613* (2013.01); *H03F 2200/102* (2013.01); *H03F 2200/351* (2013.01)

(58) Field of Classification Search
  CPC .............. H03F 1/0244; H03F 1/0211; H03F 2200/504; H03F 3/04; H04L 25/4902; H04L 27/2613; H04L 27/04; H04B 5/0031; H04B 5/02; H04B 1/04; H03C 1/62; H03G 3/3042; H03G 3/004
  USPC .............................................. 330/251, 207 A
  See application file for complete search history.

(56) References Cited

U.S. PATENT DOCUMENTS

| | | | |
|---|---|---|---|
| 10,454,532 B2* | 10/2019 | Kovacic | H04B 5/0031 |
| 2014/0057684 A1 | 2/2014 | Khlat | |
| 2014/0086301 A1 | 3/2014 | Akhavan et al. | |
| 2018/0367099 A1 | 12/2018 | Kim et al. | |
| 2019/0036568 A1 | 1/2019 | Kovacic et al. | |

* cited by examiner

DEVICE AND METHOD FOR A WIRELESS TRANSMITTER

CROSS-REFERENCE TO RELATED APPLICATIONS

This application claims the benefit of EP Application No. 19305889.8, filed on Jul. 1, 2019, which application is hereby incorporated herein by reference.

TECHNICAL FIELD

Embodiments are related to an integrated circuit and method, in particular integrated circuit including a wireless transmitter comprising a driver for controlling a signal envelope shape of a modulation pulse.

BACKGROUND

RFID ("Radio Frequency Identification") and NFC ("Near Field Communication") standards specify the modulation shapes (rising edge, falling edge, overshoots, undershoots and non-monotonicity of the edges) of the transmission device (called a RFID reader, or NFC poller).

RFID and NFC systems are magnetically coupled systems, where the presence of a receiver antenna influences the parameters of the transmitter antenna. This is usually referred to as "loading effect". The loading effect (magnetic coupling) can detune the transmitter antenna which then usually leads to distortion of the modulation shapes. Known effects are overshoot following the rising edge of the modulation pulse, or undershoot following the falling edge of a modulation pulse.

Modulation of pulses can be achieved by OOK ("On Off Keying") or ASK ("Amplitude Shift Keying"). ASK modulation is for instance used for ISO14443 TypeB standard, ISO14443 TypeA standard for bit rate 848 kbps, and for ISO15693 standard. FeliCa protocol, also called NFC-F technology, is standardized in JIS.X.6319 and is based on ASK modulation too.

Falling edges (and rising edges) of the modulation shape can typically be generated through switching from a non-carrier voltage level to a carrier voltage level supplied to the driver (and conversely).

A conventional solution to reduce undershoots and overshoots is based on switching the driver supply between the non-carrier level and the carrier level during the falling and rising edges, which generates a longer rising and falling edge on the antenna signal.

Although this conventional solution works for OOK modulation, this solution creates non-monotonic waveshapes, so it cannot be used for ASK modulation.

Therefore, it would be beneficial to have some way of configuring the modulation waveshape, particularly to reduce the undershoots and overshoots when the transmitter is loaded by an unknown receiver antenna.

SUMMARY

According to an aspect, a method is proposed for controlling a signal envelope shape of modulation pulses in a driver of a wireless transmitter, including supplying a first voltage to the driver during a non-modulated state, supplying a second voltage configurable by a configurable modulation index value to the driver during a modulated state, and switching between the non-modulated state and the modulated state, said switching comprising setting the modulation index value to configure the second voltage level at the same level as the first voltage, and then switching between supplying the first voltage to the driver and supplying the second voltage to the driver, and filtering to a limited bandwidth the variations of the second voltage resulting from configuring the modulation index value.

Thus, contrary to conventional techniques where level of modulated state supply is pre-set to the level required for the modulation, the method according to this aspect proposes switching between two supplies having the same level before or after setting the level of the modulated state supply.

In other words, when switching from the non-modulated state to the modulated state, at the start of a falling edge at the beginning of a modulation pulse, firstly the supply of the first voltage is switched to the supply of the second voltage which is at the same level, and then the modulation index value is set in accordance with the required modulation level.

Conversely, when switching from the modulated state to the non-modulated state, at the start of a rising edge at the end of a modulation pulse, firstly the modulation index value is reset from the index value established for the modulation level, to the same level as the first voltage, and then the supply of the second voltage is switched to the supply of the first voltage (which are at the same level).

Filtering to a limited bandwidth the variations of the second voltage permits to sweep smoothly between first and second voltages levels of the non-modulated and modulated states. This prevents undershoots and overshoots.

According to an embodiment, supplying the second voltage to the driver during the modulated state comprises setting the modulation index value to configure the second voltage at a level of a modulated carrier signal during the duration of a modulation pulse.

According to an embodiment, switching between the non-modulated state and the modulated state is responsive to a state control signal and setting the modulation index value is responsive to an index control signal.

According to an embodiment, supplying the second voltage comprises indexing the first voltage with the configurable modulation index value.

Thus, the modulation index between the first voltage and the second voltage remains constant.

According to an embodiment, filtering variations of the second voltage comprises using a capacitor coupled to an output supplying the second voltage. The capacitor coupled to the output supplying the second voltage can for instance be an external capacitor mounted to the wireless transceiver, or an internal capacitor integrated to the wireless transceiver.

Then, the slew rate of rising and falling edges depends on the capacitive value of the capacitor, for instance about 100 nF, the current consumption of the driver, and the value of the current sink. Advantageously, the slew rate is configured in the range of 1µs.

According to an embodiment, filtering variations of the second voltage comprises using an internal programmable resistive-capacitive circuit coupled to an input indexing a reference voltage by the configurable modulation index value.

Thus, the shape can be independent on the antenna load, provided that the second voltage supply response is fast enough to follow the shape of the reference voltage.

Of course, the reference voltage can be the first voltage.

According to an embodiment, filtering variations of the second voltage comprises setting the configurable modulation index value by using at least one intermediate setting step with an intermediate modulation index value.

Combination of this embodiment with using the external or integrated capacitor as well as the internal programmable resistive-capacitive circuit as defined in the aforementioned embodiments, can be used to filter variations of the second voltage.

In other words, the edge smoothing is done digitally by successive modulation index increase during the falling edge, and successive modulation index decrease during the rising edge. This embodiment is advantageous for example in case of fast supply or slow data rate. According to another aspect, a wireless transmitter is proposed, comprising first supplying means, second supplying means, a control circuitry, a driver for controlling a signal envelope shape of a modulation pulse, and a filtering circuitry, wherein said first supplying means are configured to supply a first voltage to the driver during a non-modulated state, said second supplying means are configured to supply a second voltage configurable by a modulation index value to the driver during a modulated state, said control circuitry is configured to switch the driver between the non-modulated state and the modulated state, by setting the modulation index value to configure the second voltage level at the same level as the first voltage and then switching the driver supply between the first supplying means and the second supplying means, and said filtering circuit is configured to filter to a limited bandwidth the variations of the second voltage resulting from setting the modulation index value.

According to an embodiment, the first supplying means comprise a first low drop out voltage regulator, and the second supplying means comprise a second low drop out voltage regulator.

According to an embodiment, the control circuitry is configured to set the modulation index value to configure the second voltage level at a level of a modulated carrier signal during the duration of a modulation pulse.

According to an embodiment, the control circuit is configured to generate a state control signal and an index control signal, the driver is configured to switch supply connection between the first supplying means and the second supplying means responsive to the state control signal, and the second supplying means are configured to set the modulation index value responsive to the index control signal.

According to an embodiment, the second supplying means are configured to index the first voltage with the configurable modulation index value to supply the second voltage.

According to an embodiment, the filtering circuit comprises a capacitor coupled to an output of the second supplying means intended to supply the second voltage.

According to an embodiment, the second supplying means include an input configured to receive a reference voltage, and are configured to index by the configurable modulation index value the reference voltage, and the filtering circuit comprises an internal programmable resistive-capacitive circuit coupled to the second supplying means input.

According to an embodiment, the control circuitry comprises the filtering circuit configured to use at least one intermediate setting step with an intermediate modulation index value to set the configurable modulation index value.

According to an embodiment, the wireless transmitter is configured to perform wireless communications according to at least one of the following standards: ISO14443 TypeA; ISO14443 TypeB; ISO15693; JIS.X.6319.

According to an embodiment, the wireless transmitter is realized in an integrated form.

Other features and advantages of the present invention will appear when examining the following detailed description, only providing non-limiting example of embodiments, with reference to the appended drawings in which:

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
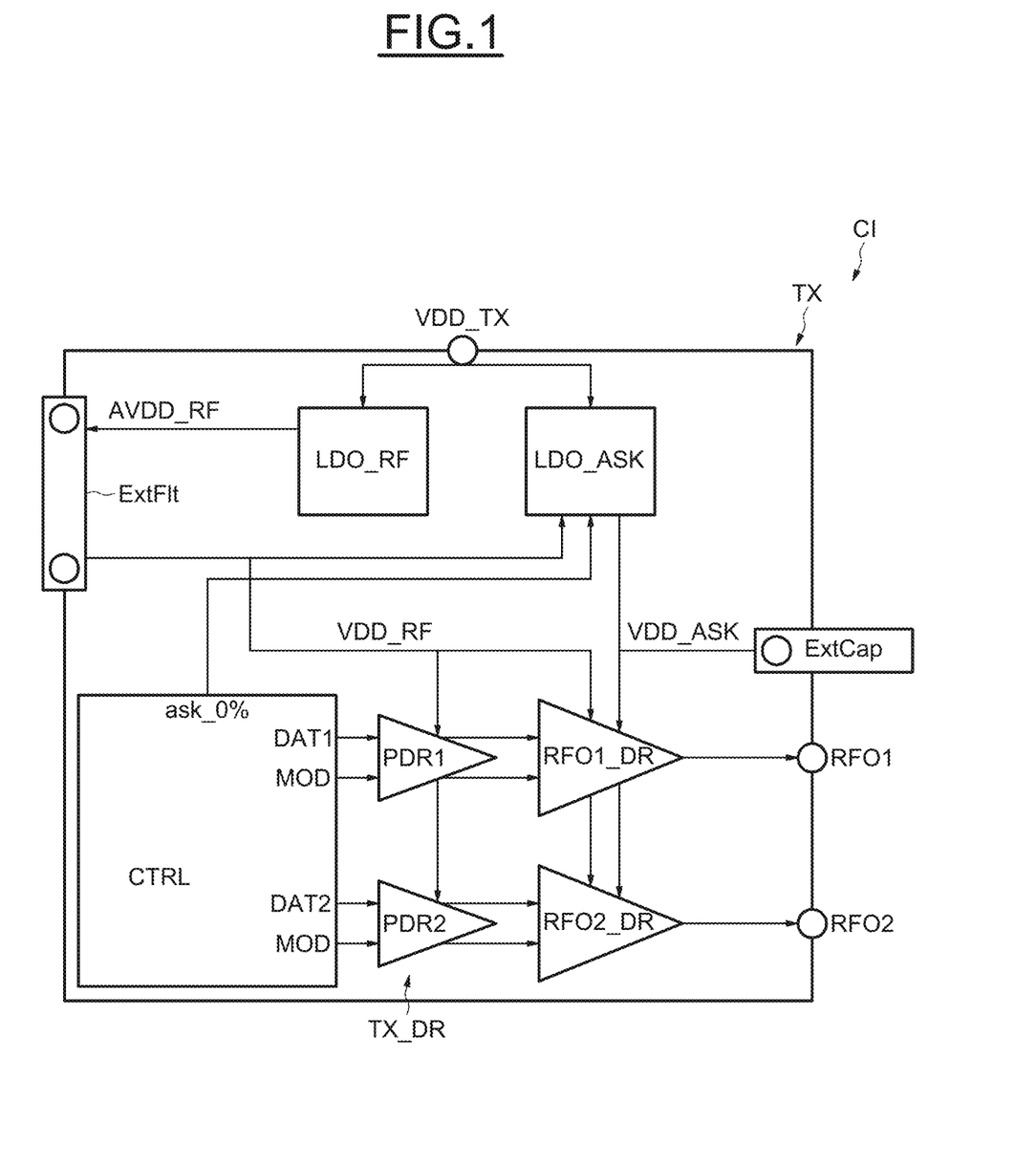
FIGS. 1 to 5 illustrate example embodiments of the invention.

FIG. 1 illustrates an integrated circuit CI comprising a wireless transmitter TX, for example configured to perform wireless communications according to ISO14443 TypeA standard, and/or ISO14443 TypeB standard, and/or ISO15693 standard, and/or JIS.X.6319.

The wireless transmitter TX comprises first supplying means, for example a first low drop out voltage regulator LDO_RF, second supplying means, for instance a second low drop out voltage regulator LDO_ASK, a control circuitry CTRL, and a driver TX_DR for controlling a signal envelope shape of a modulation pulse.

The driver TX_DR includes two channels outputting signals in phase quadrature, RFO1, RFO2. Each channel comprises a respective modulation pre-driver PDR1, PDR2, and a respective modulation driver RFO1_DR, RFO2_DR.

Pre-drivers PDRi are intended to amplify inputs, initially at a logic level, to a higher level able to control the modulation drivers RFOi_DR.

The control circuitry CTRL is configured to input the data values DAT1, DAT2 and the state control signals MOD to the pre-drivers PDRi amplifying these signals to the modulation drivers RFOi_DR.

According to the data value DATi and to the state control signal MOD, the modulation drivers RFOi_DR are configured to deliver the data in a modulated or non-modulated pulse to an antenna (not illustrated).

The antenna can be any kind of typical antenna, for instance provided with matching network and electromagnetic interference filter circuit, and also single ended antennas.

Each modulation driver RFOi_DR is configured to place itself in a modulated state to deliver a modulated pulse or in non-modulated state to deliver a non-modulated pulse, according to the state control signal MOD.

Regarding this, the driver TX_DR, more precisely each modulation driver RFO1_DR, RFO2_DR, is configured to switch supply connection between the first low drop out voltage regulator LDO_RF and the second low drop out voltage regulator LDO_ASK, responsive to the state control signal MOD.

From now, the wording driver TX_DR will refer to each modulation drivers RFO1_DR, RFO2_DR, independently from the respective channels RFO1, RFO2 and pre-drivers PDR1, PDR2 which functions have been defined above.

The first low drop out voltage regulator LDO_RF is configured to supply the first voltage VDD_RF at the level of the non-modulated signal, for instance 8.5 V.

The output of first low drop out voltage regulator LDO_RF is typically intended to be provided by an external filtering circuit ExtFlt, such as a decoupling capacitor.

The output of first low drop out voltage regulator LDO_RF can also be coupled with an internal integrated filtering circuit of the same nature and function.

The filtering circuit can also be connected in a parallel connection to the first low drop out voltage regulator LDO_RF output (contrary to the serial connection shown in the figure).

The second low drop out voltage regulator LDO_ASK is configured to supply the second voltage VDD_ASK at a configurable level value.

The second voltage level VDD_ASK is configurable by a modulation index value, and setting or varying the modulation index value is responsive to an index control signal ask_0% provided by the control circuitry CTRL to the second low drop out voltage regulator LDO_ASK.

Thus, the control circuitry CTRL is capable to control switching the driver TX_DR between the non-modulated state and the modulated state, by the means of the state control signal MOD and the index control signal ask_0%.

In the example shown, the second low drop out voltage regulator LDO_ASK is configured to generate the second voltage VDD_ASK on the basis of the first voltage VDD_RF.

Thus, when the first voltage is reduced (which could be the case when the dropout is increased, or when the battery level drops) the second voltage follows this change such that the modulation index remains constant.

In the embodiment shown, the output of the second low drop out voltage regulator LDO_ASK is intended to be coupled with a filtering circuit to filter to a limited bandwidth the variations of the second voltage VDD_ASK, for instance an external capacitor ExtCap.

Figure 5:
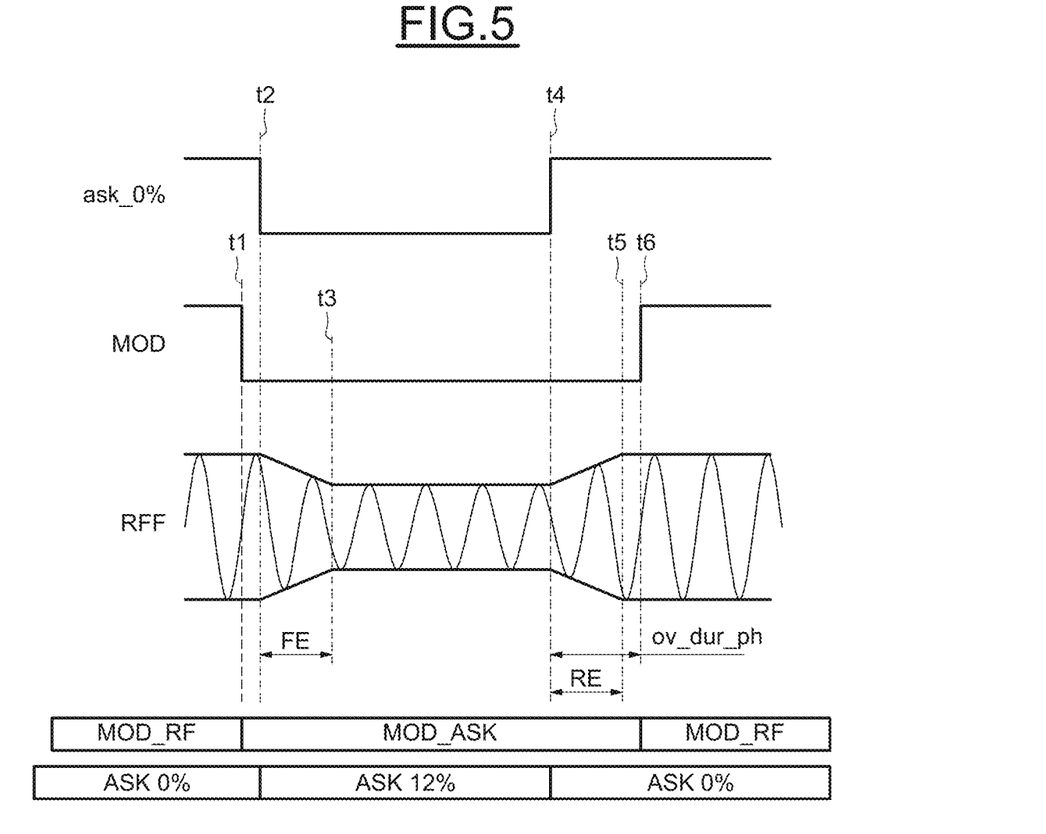

Reference is made now to FIG. 5.

FIG. 5 illustrates an example of controlling a signal envelope shape of modulation pulses implemented for instance by the wireless transmitter TX described in relation with FIG. 1.

An example of the state control signal MOD is illustrated by its logic level. Resulting modulated state MOD_ASK and non-modulated state MOD_FR are shown in vertical alignment.

An example of the index control signal ask_0% is illustrated by its logic level.

Resulting modulation index values ASK0%, ASK12% are shown in vertical alignment.

The resulting signals provided to the antenna on RFO1, RFO2 channel's outputs, in particular the levels of the resulting field, is schematically shown by the RFF oscillations.

In the non-modulated state MOD_RF, the driver TX_DR uses the first supply voltage VDD_RF supplied by the first low drop out voltage regulator LDO_FR.

In the modulated state MOD_ASK, the driver TX_DR uses the second voltage VDD_ASK supplied by the second low drop out voltage regulator LDO_ASK.

In the modulated state MOD_ASK, the modulation index value ASK12% can be set at a proper moment to configure the second voltage level VDD_ASK at a level of a modulated carrier signal, in accordance with a given communication protocol.

The control circuitry CTRL is configured to switch the driver TX_DR between the non-modulated state MOD_RF and the modulated state MOD_ASK, by the means of the state control signal MOD and the index control signal ask_0%.

The modulated/non-modulated state switching comprises firstly setting the modulation index value ASK0% to configure the second voltage level VDD_ASK at the same level as the first voltage VDD_RF. And secondly, then switching the driver supply between the first low drop out voltage regulator LDO_RF and the second low drop out voltage regulator LDO_ASK.

Setting the modulation index value ASK0% to cause the second voltage VDD_ASK being supplied at the same level as the first voltage VDD_RF is achieved, in the shown example, by providing the modulation index control signal ask_0% at the logical high level.

Conversely, setting the modulation index value ASK12% to cause the second voltage VDD_ASK being supplied at the level of a modulated carrier signal is achieved by providing the modulation index control signal ask_0% at the logical low level.

Switching the driver supply to the first voltage VDD_RF is achieved, in the shown example, by providing the state control signal MOD at the logical high level, and conversely switching to the second voltage VDD_ASK is achieved by providing the state control signal MOD at the logical low level.

When switching from the non-modulated state to the modulated state, it is assumed that the index modulation control signal is provided beforehand at the logical high level.

And then, firstly the supply of the driver is switched from the first voltage VDD_RF to the second voltage VDD_ASK responsive to the high-to-low transition of the state control signal MOD, provided at time t1.

At time t1, second voltage VDD_ASK and the first voltage VDD_RF are at the same level.

Then, secondly, the modulation index value ASK12% is set in accordance to supply the second voltage VDD_ASK at the level required for the modulation, responsive to the high-to-low transition of the modulation index control signal ask_0% provided at time t2.

Time t2 can be slightly later than t1 or at the same time.

By the action of the filtering circuit (which is configured to filter to a limited bandwidth the variations of the second voltage resulting from setting the modulation index value), the falling edge FE of the outputted signal RFF sweeps down smoothly, until time t3, to the level of the modulated carrier signal and undershoots are prevented.

Then modulation index value ASK12% is maintained as it stands during the duration of a modulation pulse according to the used communication protocol, until reaching time t4.

At time t4, the modulation pulse ends and a switch from modulated state MOD_ASK to non-modulated state MOD_RF is to be controlled.

When switching from the modulated state MOD_ASK to the non-modulated state MOD_RF, firstly the modulation index value ASK0% is (re)set to configure the second voltage level VDD_ASK back at the same level as the first voltage VDD_RF, responsive to the low-to-high transition of the modulation index control signal ask_0%.

And then, after a rising edge RE during which the outputted signal RFF sweeps up smoothly until time t5 by the filtering action of the filtering circuitry, the supply of the driver is switched from the second voltage VDD_ASK to the first voltage VDD_RF, responsive to the low-to-high transition of the state control signal MOD provided at time t6.

At time t6, the second voltage VDD_ASK and the first voltage VDD_RF are at the same level.

On top of this, a parameter ov_dur_ph is introduced to define the timing between the time t4, when the down-to-high transition of modulation index control signal ask_0% occurs, and time t6, when the down-to-high transition of the state control signal MOD occurs.

This parameter ov_dur_ph is programmable in order to provide flexibility for the selection of the filtering circuitry, for example the selection of the capacitive value of the external capacitor ExtCap mentioned before in relation with FIG. 1.

Figure 2:
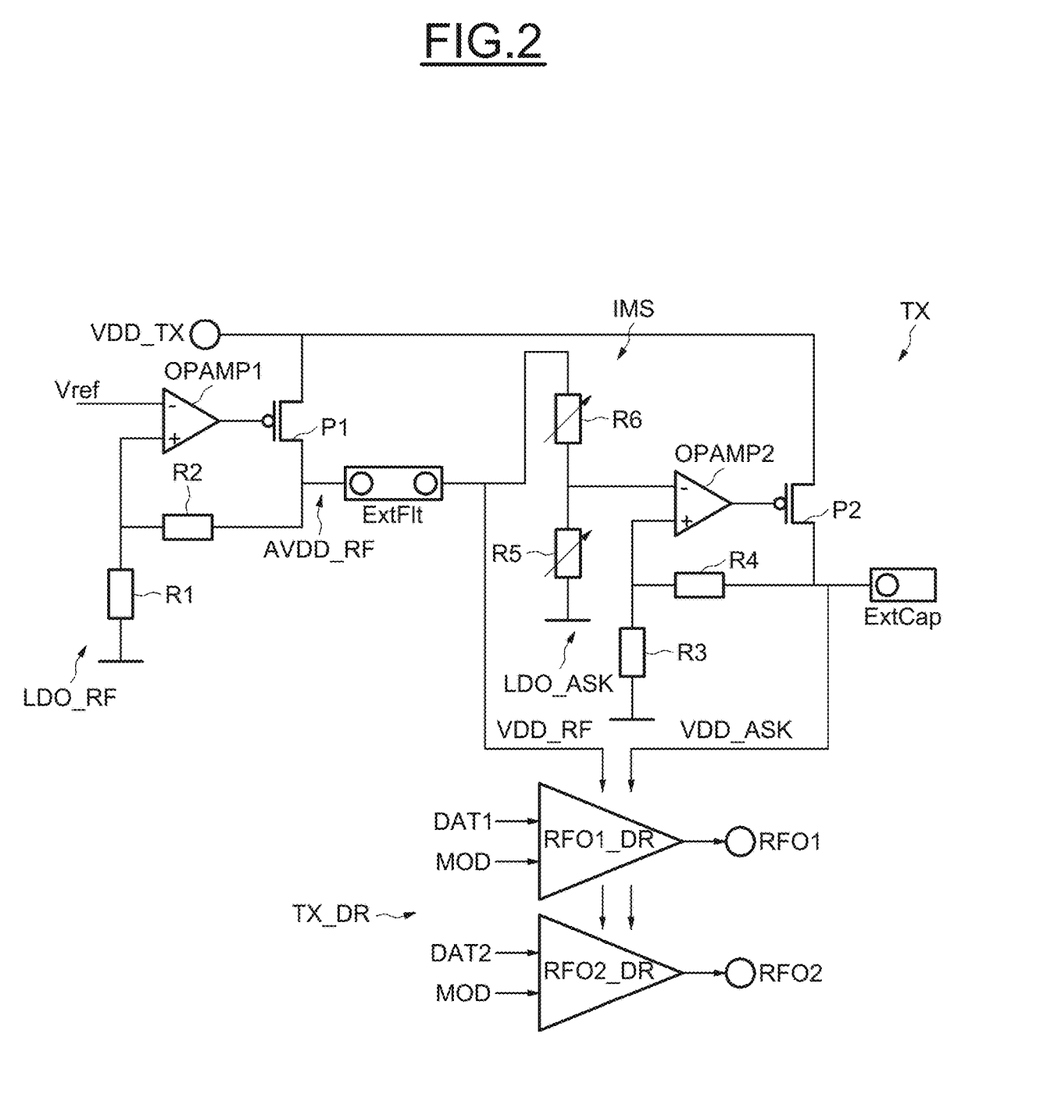

Reference is made now to FIG. 2.

FIG. 2 illustrates an example of embodiment of the first low drop out voltage regulator LDO_RF, the second low drop out voltage regulator LDO_ASK, and more particularly a first embodiment of the filtering circuitry.

Similar driver TX_DR of the transceiver TX as previously described in relation with FIG. 1 is implemented, and modulation drivers RFO1_DR and RFO2_DR are illustrated.

The first low drop out voltage regulator LDO_RF comprises an operating amplifier OPAMP1 which output controls a PMOS transistor P1 coupled to a reference supply voltage VDD_TX and outputting a regulated output AVDD_RF. The regulated output AVDD_RF is filtered through a conventional external filter ExtFlt and then provides the first voltage VDD_RF.

The output AVDD_RF is fed-back to positive input of the operating amplifier OPAMP1 by a resistive bridge circuit R1, R2, while negative input receives a reference voltage Vref, basically forming a restive gain amplifier.

The second low drop out voltage regulator LDO_ASK is of the same design and comprises an operating amplifier OPAMP2 controlling a PMOS P2 outputting the second voltage VDD_ASK from the reference supply voltage VDD_TX.

The output VDD_ASK is fed-back to positive input through a resistive bridge circuit R3, R4, basically forming a restive gain amplifier. The negative input of the comparator is fed by the first voltage VDD_RF through a configurable resistive bridge circuit R5, R6. The configurable bridge circuit R5, R6 comprises two configurable resistors R5 and R6 in serial connection between first voltage VDD_RF output and a reference ground voltage.

The configurable bridge circuit R5, R6, together with the resistive-gain amplifier, are forming an index modulation setting circuitry IMS, wherein the index value is configurable by configuring the resistive values of configurable resistors R5, R6 (with respect to the resistive values of resistors in the resistive bridge R3, R4).

The filtering circuit can comprise an external capacitor ExtCap in parallel connection to the output of the second low drop out voltage regulator LDO_ASK, where the second voltage VDD_ASK is supplied.

The external capacitor ExtCap is thereby configured to filter to a limited bandwidth the variations of the second voltage VDD_ASK resulting from setting the modulation index value.

For instance, the external capacitor ExtCap is intended to have a capacitance value of about 100 nF, depending of the targeted slew rate value, the current consumption of the driver, and the current sink in the second regulator LDO_ASK. Of course, the capacitance value of the external capacitor ExtCap is also chosen in accordance with the load caused by the antenna to be driven.

In an alternative option, the filtering circuit can comprise an internal integrated capacitor with the same connections and the same functions as the aforementioned external capacitor ExtCap.

Figure 3:
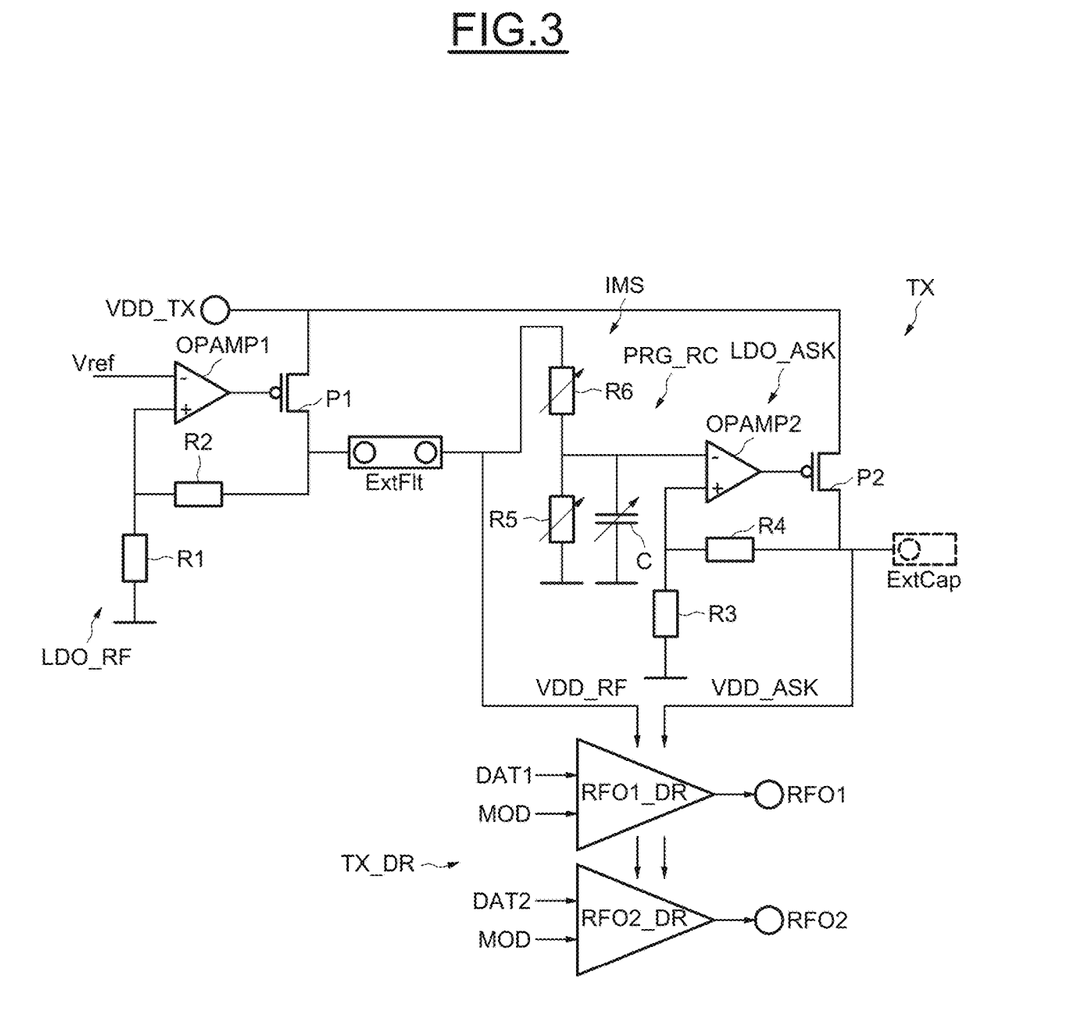

FIG. 3 illustrates another embodiment of the filtering circuitry.

This other embodiment comprises all the elements described before with reference to FIG. 2, and these elements are assigned by the same references and are not detailed again here.

In this other embodiment, the filtering circuit comprises an internal programmable resistive-capacitive circuit PRG_RC coupled to the second low drop out regulator LDO_ASK input.

In the shown example the programmable resistive-capacitive circuit PRG_RC is provided by adjunction of a configurable capacitor C to the configurable resistive bridge R5, R6.

Thus, the filtering circuitry filters to a limited bandwidth the variations of the indexation as such. The indexation affects the first voltage VDD_RF which is used as a reference voltage. The filtering circuitry then filters the variations of the outputted second voltage VDD_ASK resulting from setting the modulation index value.

An external or internal integrated capacitor ExtCap as previously described in relation with FIG. 2 can be provided in combination, but is not mandatory.

Figure 4:
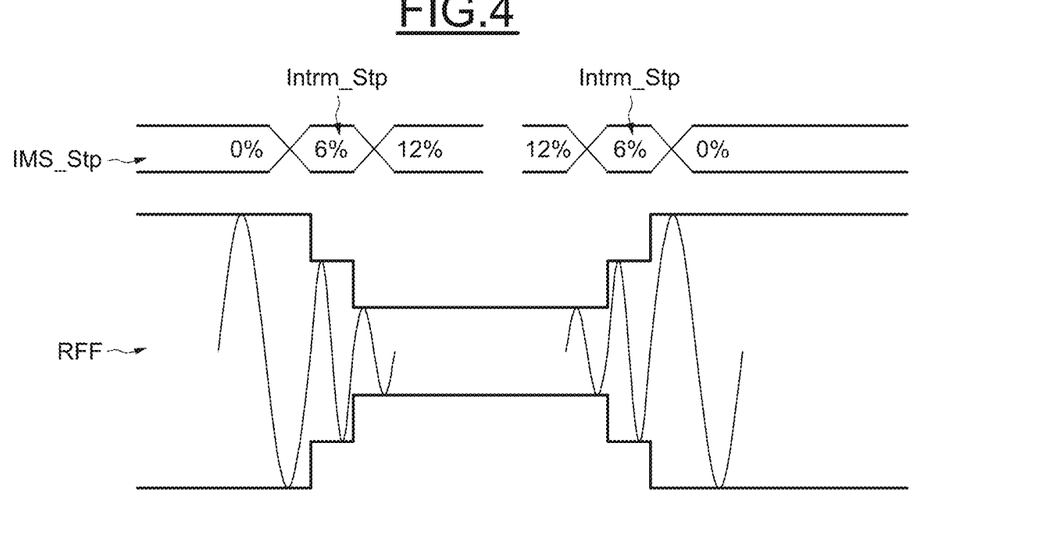

FIG. 4 illustrates an example behavior of another embodiment of the filtering circuit.

In this embodiment, filtering the variations of the second voltage VDD_ASK which results from setting the modulation index value is digitally controlled by the control circuitry CTRL.

To this end, the control circuitry CTRL is configured to control the index modulation setting circuitry IMS, as described before in relation with FIG. 2 or 3, with a digitally-controlled stepping control signal IMS_Stp.

The stepping control signal IMS_Stp is configured to command at least one intermediate setting step Intrm_Stp with an intermediate modulation index value to set the configurable modulation index value.

In the example shown, one intermediate step Intrm_Stp is implemented at a half of the final index value. For instance, if the index value causes a falling/rising edge by switching from a 12% indexation and a 0% indexation, then the intermediate setting step is implemented at a 6% indexation value.

Other intermediate steps can be chosen in any suitable way, for instance three intermediate setting step varying third-by-third to the final indexation value, or any other varying dynamic.

The resulting field in the antenna RFF thereby sweeps smoothly between a non-modulated pulse level and a modulated pulse level, in a similar shape as described before in relation with FIG. 5.

The digitally controlled filtering of this embodiment can also be combined with the external or integrated capacitor ExtCap and/or the internal configurable filtering circuit PRG_RC as described before in relation with the filtering circuit embodiments of FIGS. 2 and 3.

In summary, embodiments have been disclosed to describe the modulation waveshape of an amplitude shift keying modulated signal, generated by a voltage sweep on the VDD_ASK regulator, which is used to define the amplitude shift keying modulation index. At the start of the modulation falling edge, the driver supply switches from the VDD_RF regulator (the regulator which defines the non-modulated carrier level) to the VDD_ASK regulator, which has the same voltage output as the VDD_RF regulator. The VDD_ASK output voltage then sweeps down to the pre-defined level needed for the pre-defined modulation index. This sweep generates a sweep in the envelope signal. For the duration of the modulation pulse, the VDD_ASK level is kept (it defines the modulated carrier level). At the end of the modulation pulse, the VDD_ASK regulator output is swept back to the VDD_DR level, at which point the driver supply switches back to the VDD_RF regulator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for controlling a signal envelope shape of a modulation pulse in a driver of a wireless transmitter, the method comprising:
   supplying a first voltage to the driver during a non-modulated state;
   supplying a second voltage configurable by a configurable modulation index value to the driver during a modulated state;
   switching between the non-modulated state and the modulated state, the switching comprising setting the modulation index value to configure the second voltage at a same level as the first voltage, and then switching between supplying the first voltage to the driver and supplying the second voltage to the driver; and
   filtering, to a limited bandwidth, variations of the second voltage resulting from configuring the modulation index value.

2. The method according to claim 1, wherein supplying the second voltage to the driver during the modulated state comprises setting the modulation index value to configure the second voltage at a level of a modulated carrier signal during a duration of the modulation pulse.

3. The method according to claim 1, wherein switching between the non-modulated state and the modulated state is responsive to a state control signal and setting the modulation index value is responsive to an index control signal.

4. The method according to claim 1, wherein supplying the second voltage comprises indexing the first voltage with the configurable modulation index value.

5. The method according to claim 1, wherein filtering the variations of the second voltage comprises using a capacitor coupled to an output of the second voltage.

6. The method according to claim 1, wherein filtering the variations of the second voltage comprises using an internal programmable resistive-capacitive circuit coupled to an input indexing a reference voltage by the modulation index value.

7. The method according to claim 1, wherein filtering the variations of the second voltage comprises setting the modulation index value using at least one intermediate modulation index value before using a final modulation index value.

8. The method according to claim 1, further comprising performing wireless communications according to at least one of the following standards: ISO14443 TypeA; ISO14443 TypeB; ISO15693; or JIS.X.6319.

9. A wireless transmitter comprising:
   a first voltage supply configured to supply a first voltage to a driver during a non-modulated state;
   a second voltage supply configured to supply a second voltage configurable by a modulation index value to the driver during a modulated state;
   the driver, configured to controlling a signal envelope shape of a modulation pulse;
   a control circuit configured to switch the driver between the non-modulated state and the modulated state, by setting the modulation index value to configure the second voltage at a same level as the first voltage and then switching between the first voltage supply and the second voltage supply supplying the driver; and
   a filtering circuit configured to filter, to a limited bandwidth, variations of the second voltage resulting from setting the modulation index value.

10. The wireless transmitter according to claim 9, wherein the first voltage supply comprises a first low drop out voltage regulator, and the second voltage supply comprises a second low drop out voltage regulator.

11. The wireless transmitter according to claim 9, wherein the control circuit is configured to set the modulation index value to configure the second voltage at a level of a modulated carrier signal during a duration of the modulation pulse.

12. The wireless transmitter according to claim 9, wherein the control circuit is configured to generate a state control signal and an index control signal, the driver is configured to switch supply connection between the first voltage supply and the second voltage supply responsive to the state control signal, and the second voltage supply is configured to set the modulation index value responsive to the index control signal.

13. The wireless transmitter according to claim 9, wherein the second voltage supply is configured to index the first voltage with the modulation index value to supply the second voltage.

14. The wireless transmitter according to claim 9, wherein the filtering circuit comprises a capacitor coupled to an output of the second voltage supply.

15. The wireless transmitter according to claim 9, wherein the second voltage supply includes an input configured to receive a reference voltage, and is configured to index by the modulation index value the reference voltage, and the filtering circuit comprises an internal programmable resistive-capacitive circuit coupled to the input of the second voltage supply.

16. The wireless transmitter according to claim 9, wherein the control circuit is configured to set at least one intermediate modulation index value before setting a final modulation index value.

17. The wireless transmitter according to claim 9, wherein the wireless transmitter is configured to perform wireless communications according to at least one of the following standards: ISO14443 TypeA; ISO14443 TypeB; ISO 15693; or JIS.X.6319.

18. The wireless transmitter according to claim 9, wherein the wireless transmitter is an integrated circuit.

19. The wireless transmitter according to claim 9, wherein the filter circuit is configured to filter the variations of the second voltage using an internal programmable resistive-capacitive circuit coupled to an input indexing a reference voltage by the modulation index value.

20. The wireless transmitter according to claim 19, wherein the filter circuit is configured to filter the variations of the second voltage using at least one intermediate modulation index value before using a final modulation index value.

* * * * *